United States Patent [19]

Nanbu et al.

[11] Patent Number: 4,459,556
[45] Date of Patent: Jul. 10, 1984

[54] FIELD EFFECT TRANSISTOR

[75] Inventors: Shutaro Nanbu; Atsushi Nagashima, both of Ibaraki; Gota Kano, Nagaokakyo, all of Japan

[73] Assignee: Matsushita Electric Industrial Co., Ltd., Kadoma, Japan

[21] Appl. No.: 539,634

[22] Filed: Oct. 7, 1983

Related U.S. Application Data

[63] Continuation of Ser. No. 229,266, Jan. 28, 1981, abandoned.

[30] Foreign Application Priority Data

Jan. 30, 1980 [JP] Japan .................................. 55-10786

[51] Int. Cl.³ .......................................... H01L 29/76
[52] U.S. Cl. .................................. 330/278; 330/277; 357/22
[58] Field of Search .................... 357/22, 22 G, 22 S; 330/277, 278

[56] References Cited

PUBLICATIONS

Nanbu et al., "A Dual-Gato MESFET for a High Performance UHF TV Tuner", Conference: International Electron Devices Meeting Technical Digest, Washington, DC, USA, (Dec. 8-10, 1980), pp. 126-129.
Turner et al., "Schottky-Barrier FET's... Next Low-Noise Designs", Microwaves, Apr. 1972, vol. 11, No. 4, pp. 44, 46-49.
D. L. Mo, "The Cascode JFET as a Means to Avoid Excess Gate Current", IEE Transactions on Electron Devices, Aug. 1971, pp. 603-604.

Primary Examiner—James W. Davie
Attorney, Agent, or Firm—Cushman, Darby & Cushman

[57] ABSTRACT

A dual gate Schottky barrier gate GaAs FET with improved cross-modulation characteristics when used in a UHF gain controlling tuner, having a value of 40 mA or smaller of a drain to source saturation current, the improvement of the FET is that length of a second gate which is disposed between a first gate and a drain is 1.5 μm or longer.

4 Claims, 11 Drawing Figures

FIELD EFFECT TRANSISTOR

This is a continuation of application Ser. No. 229,266, filed Jan. 28, 1981, abandoned.

BACKGROUND OF THE INVENTION

1. Field of the Invention

The present invention relates to an improvement of a dual gate GaAs FET.

2. Description of the Prior Art

Recently, the dual gate GaAs FETs which have a superior high frequency characteristic as well as a high gain are being developed.

The main feature of the dual gate structure FET is a superior gain control characteristics. That is, by impressing a D.C. bias voltage on a second gate, a gain control with small input and output detunings is easily obtainable. In case, the dual gate structure GaAs FET is used in a tuner or a front end stage of a television set, it is necessary to design its drain to source saturation current $I_{DSS}$ to be smaller than 40 mA (which corresponds to the voltage $V_{G2SC}$ second-gate and the source to cut off the drain current of 3.0 V). Such dual gate structure GaAs FET having the $I_{DSS}$ under 40 mA has had a poor cross modulation characteristic, especially at large gain reduction range, thereby forming a major cause of hindering wide actual use of such FET in the home use in television tuners.

In general, the distortion is dependent on the linearity of a curve between voltage $V_{G1S}$ between the second gate and the source and mutual conductance Gm (which is defined by $Gm=dI_{DS}/dV_{G1S}$, where $I_{DS}$ is a drain to source current), and in amplifiers, the distortion mainly consists of a third distortion which is induced by a secondary term of the curve. By expressing the drain current $I_D$ as follows:

$$I_{DS}=I_{DO}+\alpha V_{G1S}+\beta V_{G1S}^2+\gamma V_{G1S}^{-3} \qquad (1),$$

where $I_{DO}$, $\alpha$, $\beta$ and $\gamma$ are constants, and the amplitude $A_u$ of undesired signal by $$A_u=V_u(1+m_u\cos pt) \qquad (2),$$

where $m_u$ is a constant, then, intensity of the distortion $m_k$ is expressed by:

$$m_k=3(\gamma/\alpha)V_u^2 m_u \qquad (3).$$

In a high frequency range, the linearity of the Gm can be regarded substantially dependent on the linearity of the S parameter $|S_{21}|$ with respect to the gate voltage $V_{G1S}$. FIG. 1 shows characteristic curves of relations between the S parameter $|S_{21}|$ at 1 GHz and gate bias voltage $V_{G1S}$ first gate to source voltage) of a conventional Schottky barrier dual gate GaAs FET for ordinary communication use where $I_{DSS}$ is 50 to 70 mA (corresponding to $V_{G2SC}$ (second gate to source voltage to cut off drain current) of 3 to 5 V). In the conventional Schottky barrier dual gate GaAs FET, both the lengths of the first gate and the second gate are designed about 1 µm. FIG. 2 shows cross-modulation characteristic of the abovementioned dual gate GaAs FET, wherein the ordinate is graduated with such levels of undesired signal of 30% modulation that which induces a 1% distortion to a desired signal and the abscissa is graduated by gain reduction (in dB). The curve of FIG. 2 is obtained by changing the first gate bias $V_{G1S}$ and the second gate bias $V_{G2S}$ along an oblique broken line in FIG. 1, that is by changing $V_{G1S}$... from $-2$ V to $-0.5$ and $V_{G2S}$... from $+2$ V to pinch off voltage ($-3$ to $-5$ V), respectively, where the undesired signal frequency or the interference signal frequency fu is 762 MHz and desired signal frequency fd is 750 MHz. In an actual amplifier, the curve of FIG. 2 should be in the area defined as above the dotted oblique broken line therein. The curve of FIG. 2 has two sags, one at the gain reduction of about $-5$ dB and the other at the gain reduction of about $-20$ dB, showing poor cross-modulations around these areas, which correspond to the parts of poor linearity of the curves in FIG. 1. Though there is some sags in the characteristic curve of FIG. 2, the curves being above the broken line fulfills actual demand for the cross modulation. However, when the drain current $I_{DSS}$ is set under 40 mA in order to fulfill the demand for home-use appliances, the distortion characteristics become worse, thereby hindering wide usage of the FET in actual circuits. FIG. 3 shows the cross-modulation characteristic of another dual gate GaAs FET, wherein $I_{DSS}$ is set to such a small value as 20 mA. As shown by the curve of FIG. 3, such dual gate GaAs FET of small $I_{DSS}$ has a poor cross-modulation characteristic around the gain reduction of $-30$ dB. The inventors confirmed through experiments that the smaller the $I_{DSS}$ is set, the poorer the distortion characteristic becomes.

SUMMARY OF THE INVENTION

The present invention has as its object to provide an improved dual gate GaAs FET of a small $I_{DSS}$ (drain saturation current), wherein the improvement is made to attain an improved distortion characteristic.

DESCRIPTION OF THE PREFERRED EMBODIMENT

A dual gate Schottky barrier gate GaAs FET having a value of 40 mA or smaller of a drain to source saturation current characterized in that the length of a second gate which is disposed between a first gate and a drain is 1.5 μm or longer.

Figure 4:
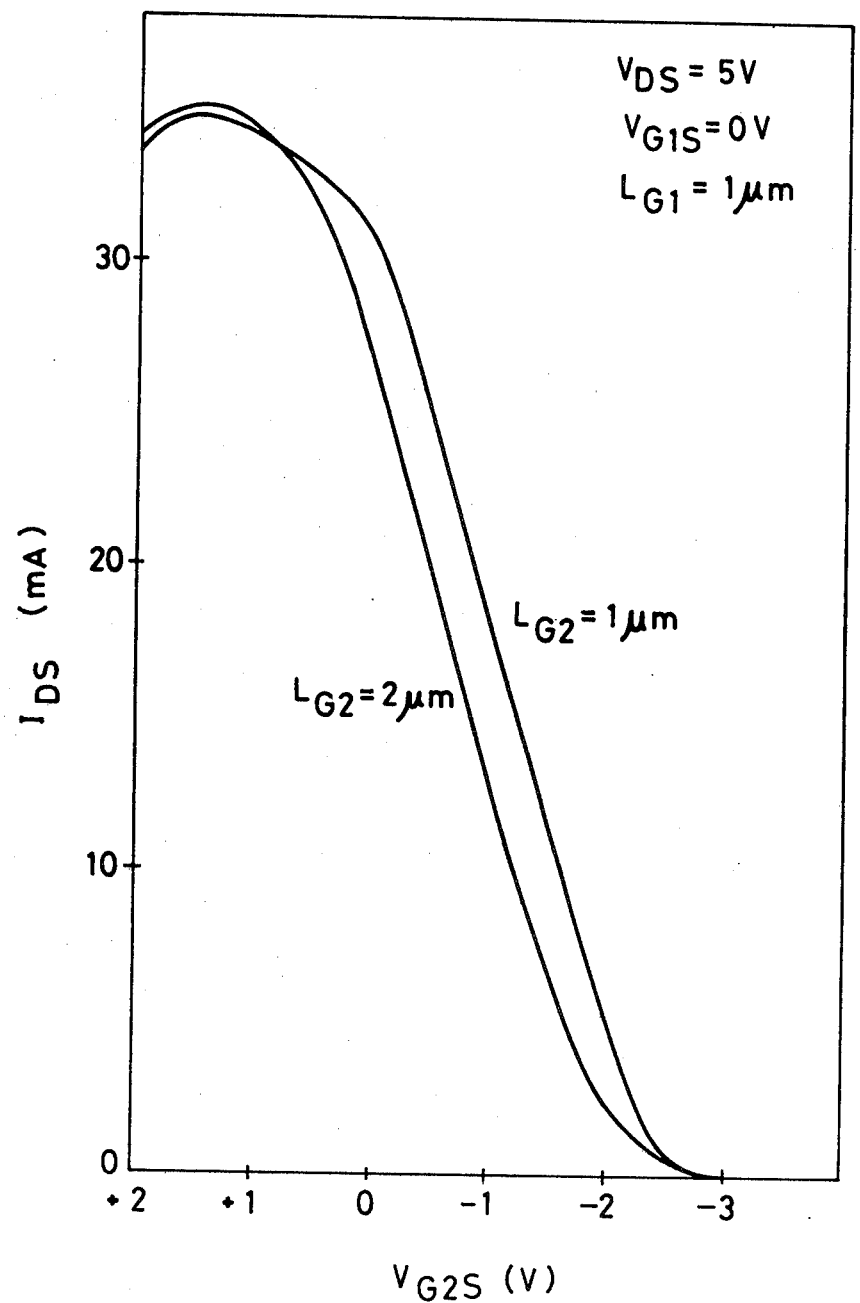
FIG. 4 is a graph showing relations between $I_{DS}$ (drain to source current) and $V_{G2S}$ (voltage between the second gate and the source) of the present invention.

FIG. 4 shows characteristic curves between $I_{DS}$ (source to drain current) and $V_{G2S}$ (voltage between the second gate and source), for the examples of the gate electrode length $L_{G2}$ of 1 μm and 2 μm. As shown in FIG. 4, the example of $L_{G2}=2$ μm has such advantages over the other example of $L_{G1}=1$ μm that $I_{DS}$ starts to decrease from the smaller $|V_{G2S}|$ voltage and that near the pinch off area (that is near the area of $V_{G2S}=-2.0$ V) the curve smoothly bends. Those are reflected in the $|S_{21}|$ vs. $V_{G2S}$ curve of FIG. 5, where the curve for $L_{G2}=2$ μm has better linearity than the curve for $L_{G2}=1$ μm. That is, the example of $L_{G2}=2$ μm is superior to the example of $L_{G2}=1$ μm in linearity around the gain reduction of $-30$ dB, and this means the superiority of the cross-modulation characteristics for the part of $L_{G2}=2$ μm. That is to say, the cross-modulation is dependent on the linearity of the S parameter $|S_{21}|$, and hence the distortion can be improved by improving the linearity of $|S_{21}|$.

Figure 6:
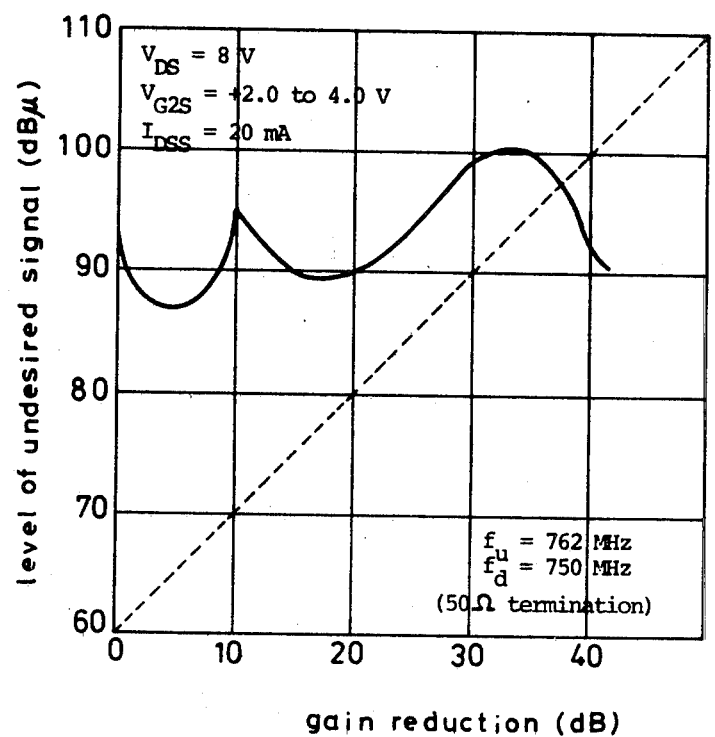
FIG. 6 is a graph of cross-modulation characteristic showing relation between gain reduction and level of undesired signal of a dual gate GaAs FET embodying the present invention.

FIG. 6 is a graph of a distortion characteristic curve showing a relation between the level of undesired signal and gain reduction, for a dual gate GaAs FET having the following gate lengths the first gate length $L_{G1}=1$ μm, and the second gate length $L_{G2}=2$ μm.

The curve of FIG. 6 is obtained by plotting the operational points by changing $V_{G2S}$ and $V_{G1S}$ simultaneously as follows:

$V_{G2S}$ ... from $+2.0$ V to $-2.0$ V and $V_{G1S}$ ... from $-1.5$ V to $-0.2$ V.

Figure 1:
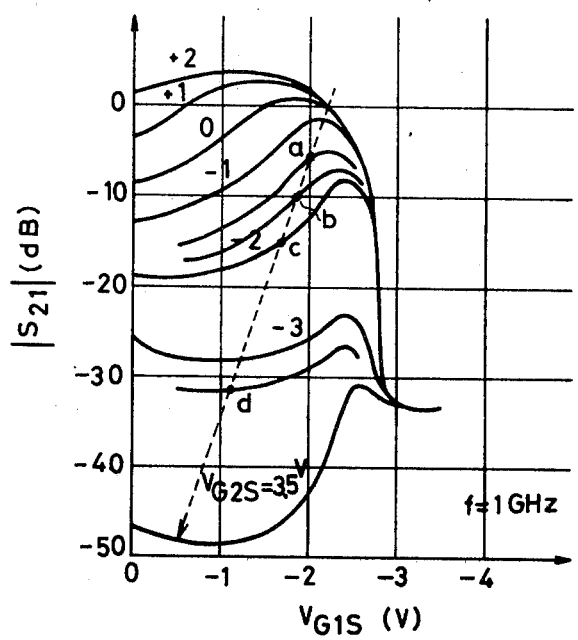
FIG. 1 is a graph of a characteristic curve showing relation between $|S_{21}|$ (S parameter) and $V_{G1S}$ (voltage between the first gate and the source).
Figure 2:
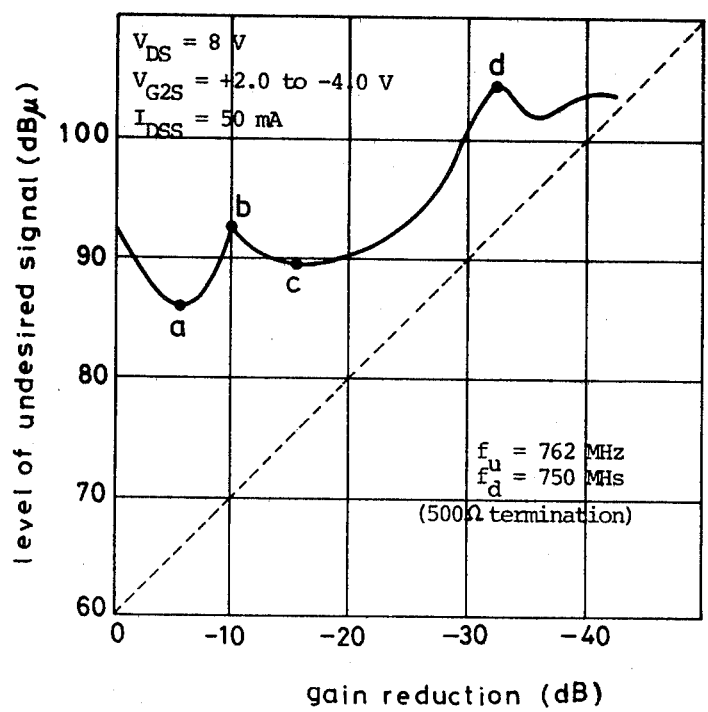
FIG. 2 is a graph of cross-modulation characteristic showing relation between gain reduction and level of undesired signal of a conventional dual gate GaAs FET having a large $I_{DSS}$ (drain to source saturation current).
Figure 3:
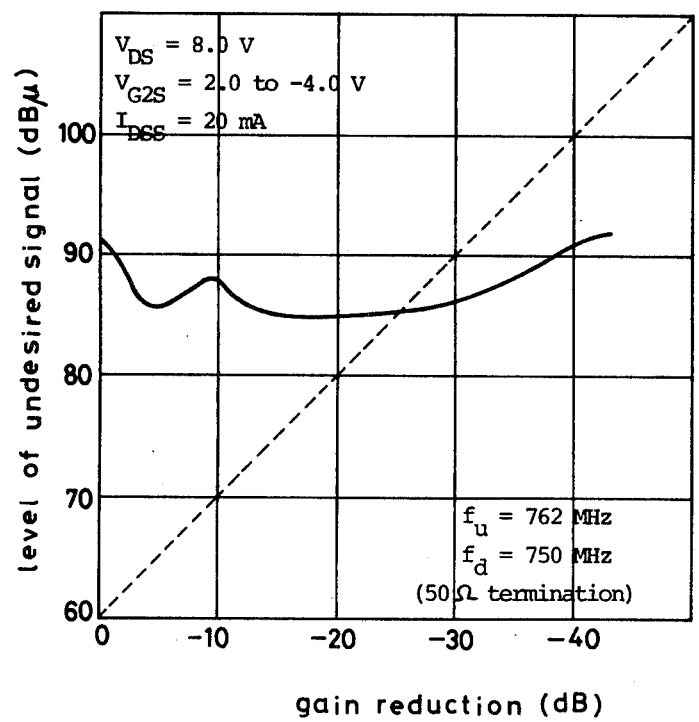
FIG. 3 is a graph of cross-modulation characteristic showing relation between gain reduction and level of undesired signal of a conventional dual gate GaAs FET having a small $I_{DSS}$.

By comparing FIG. 6 with FIG. 3, it is obvious that the distortion is improved at the range around the gain reduction of $-30$ dB. As a result of such improvement of the linearity at the large gain reduction range, the dual gate GaAs FET in accordance with the present invention has enough applicability in practical use in home use television sets or the like appliances. The inventors confirmed through many experiments that the decrease of the distortion appears for the second gate length $L_{G2}$ of $L_{G2}>1.5$ μm.

Figure 7:
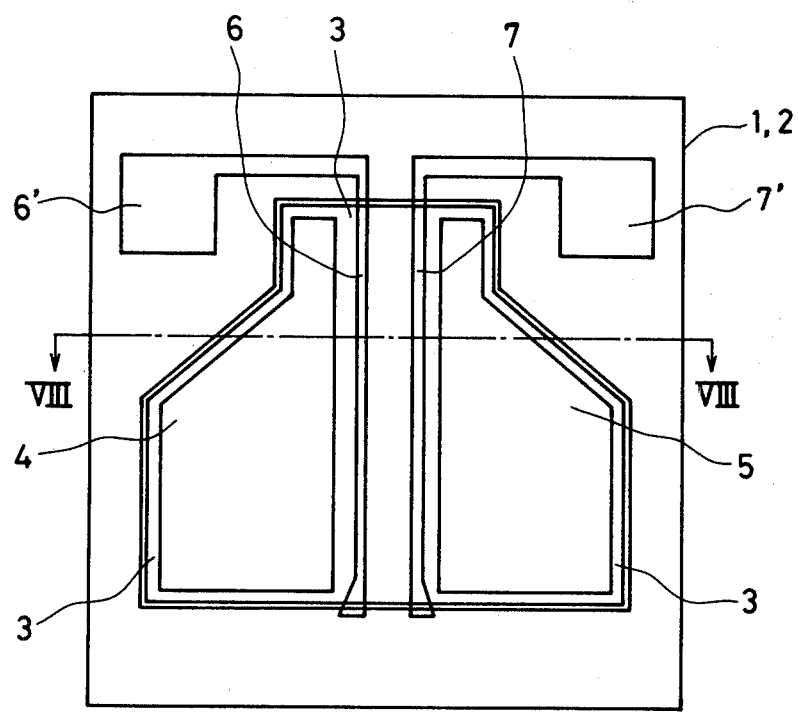
FIG. 7 is a plan view of an example of an FET of the present invention.
Figure 8:
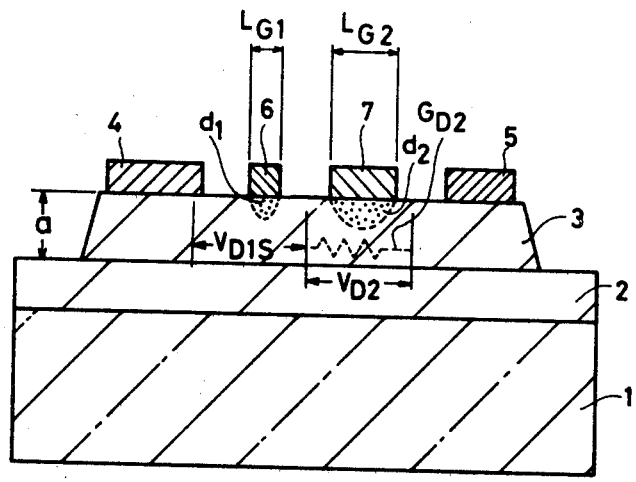
FIG. 8 is a sectional elevation view at the sectional plan VIII—VIII of the present invention.

FIG. 7 and FIG. 8 show an actual example of dual gate GaAs FET embodying the present invention, wherein on a semi-insulating single crystalline n-GaAs wafer 1, a buffer layer 2 of single crystalline n-GaAs and an active layer 3 to become a channel layer of FET of single crystalline n-GaAs are formed by sequential epitaxial growth. The active layer 3 is then selectively mesa-etched to form a plan view pattern thereof as shown in FIG. 7. Than a source electrode 4, a drain electrode 5, a first gate electrode 6 and a second gate electrode 7 are formed in the patterns as shown in FIG. 7. The source and drain electrodes are formed by Au-Ge alloy so as to make ohmic contacts with the active layer 3 and the first and the second gate electrodes are formed by Cr or Ni so as to form Schottky contacts with the active layer 3. As shown in FIG. 7 and FIG. 8, the lengths $L_{G1}$ and $L_{G2}$ of the first gate and the second gate are selected as follows:

$L_{G1} \approx 1$ μm and $L_{G2}>1.5$ μm.

Figure 9:
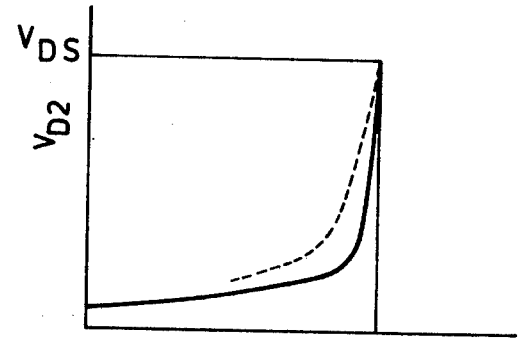
FIG. 9 is a graph showing a relation between $V_{G2S}$ and voltage drop $V_{D2}$ under the second gate of the FET of FIG. 8 and FIG. 9.
Figure 10:
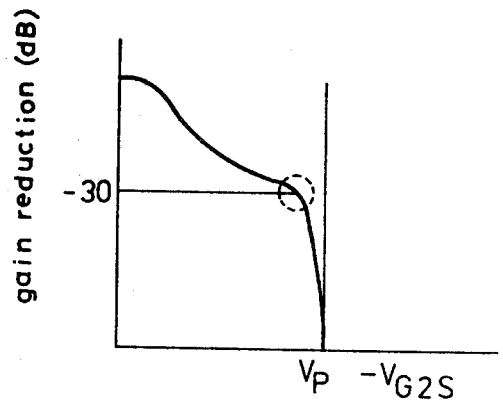
FIG. 10 is a graph showing a relation between $V_{G2S}$ and gain reduction.

In general, when a negative bias is impressed on the second gate 7 to attain a gate controlling, a depletion layer $d_2$ spreads underneath the second gate 7 as shown in FIG. 8. Then, when a signal is impressed to the first gate 6, a depletion layer $d_1$ is formed under the first gate 6. The depletion layer $d_2$ formed by the second gate works to increase a resistance $R_{D2}$ and thereby increase a voltage drop $V_{D2}$ under the second gate 7. Accordingly the voltage $V_{D1S}$ between the drain and source decreases. A dual gate FET can be regarded equivalent to a series connection of two FETs, the first one of them including the first gate 6 and the second one of them including the second gate 7 and source of the first FET and the drain of the second FET is the surface part of the active layer 3 at the part between the first gate 6 and the second gate 7. Therefore, the voltage $V_{D1S}$ is regarded as drain to source voltage of the first FET having the first gate 6; and when the voltage $V_{D1S}$ is lowered then the Gm of the first FET becomes lowered thereby its gain is suppressed. Hereupon, the voltage $V_{D2}$ increases as the depletion layer $d_2$ expands gradually nearing to the pinch off state; and when the second gate voltage $V_{G2S}$ nears to the pinch off voltage as shown by FIG. 9, the voltage $V_{D2}$ rapidly increases, thereby rapidly lowering the $V_{D1S}$ and hence lowering the gain of the signal impressed on the first gate 6. The cross-modulation is induced mainly by non-linearity of the Gm on which the controlled gain substantially depends, and this is observed in FIG. 10, wherein the curve has a considerable non-linear part indicated in a dot circled part, where the gain reduction is about $-30$ dB. In the dual gate GaAs FET of small $I_{DSS}$, depth of the active layer shown in FIG. 8 is small, and therefore, the depletion layer is supposed to expand to the pinch-off state with a smaller $V_{G2S}$ than the FET of larger $I_{DSS}$. Therefore, an improvement of the distortion (cross-modulation) is attainable by improving the linearity indicated by the dotted circle in FIG. 10. For such improvement of the linearity, it is supposed that the curve of FIG. 9 should be preferably improved to have more smooth bending as shown by the broken line curve of FIG. 9. For such purpose, it is preferable to select the resistance $R_{D2}$ of the channel part under the second gate to be larger hence to make the $V_{D2}$ larger. It is supposed that such increase of the resistance $R_{D2}$ is attained by the increasing of the length $L_{G2}$ of the second gate. And through many experiments the inventors confirmed that the necessary condition for the FET of 40 mA or smaller $I_{DSS}$ is:

$L_{G2}>1.5$ μm.

Figure 11:
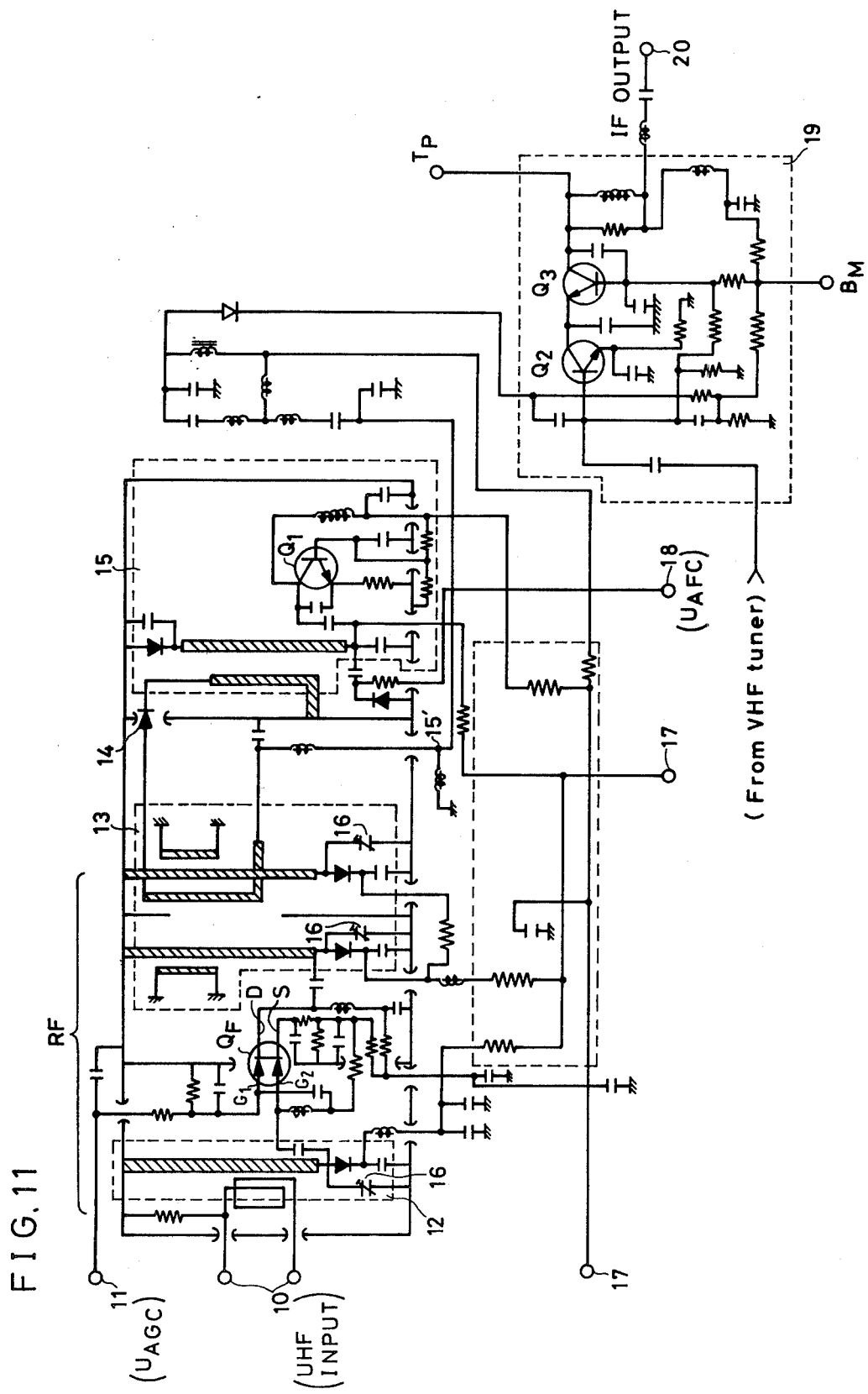
FIG. 11 is a circuit diagram of a tuner embodying the dual gate FET of the present invention.

FIG. 11 is a circuit diagram of a UHF tuner which employs the dual gate GaAs FET Q in accordance with the present invention used as varactors in a resonator. This tuner has a satisfactory low noise and low cross-modulation characteristics. In FIG. 11, the UHF input terminals 10 receive UHF input signal, for example UHF television signal of 500 to 900 MHz from an antenna. The terminal 11 receives an AGC signal (a D.C. voltage). The numeral $Q_F$ designates a dual gate GaAs FET in accordance with the present invention, wherein marks S designates the source,
D designates the drain,
$G_1$ designates the first gate, and
$G_2$ designates the second gate. A block 12 is an input tuning circuit, a block 13 is an inter-stage tuning circuit, a diode 14 is a mixer diode, block 15 is a local oscillator, a terminal 15' is an intermediate frequency (IF) signal output terminal, varactor diodes (variable capacitance diodes) 16, 16 are impressed with tuning voltage given through a terminal 17, and a power input terminal 27 receives a D.C. power from a D.C. source not shown here. An AFC terminal 18 receives an AFC signal. Q1 is a local oscillator transistor. An IF amplifier 19 has amplifier transistors Q2 and Q3 and outputs amplified IF signal from its output terminal 20.

Figure 5:
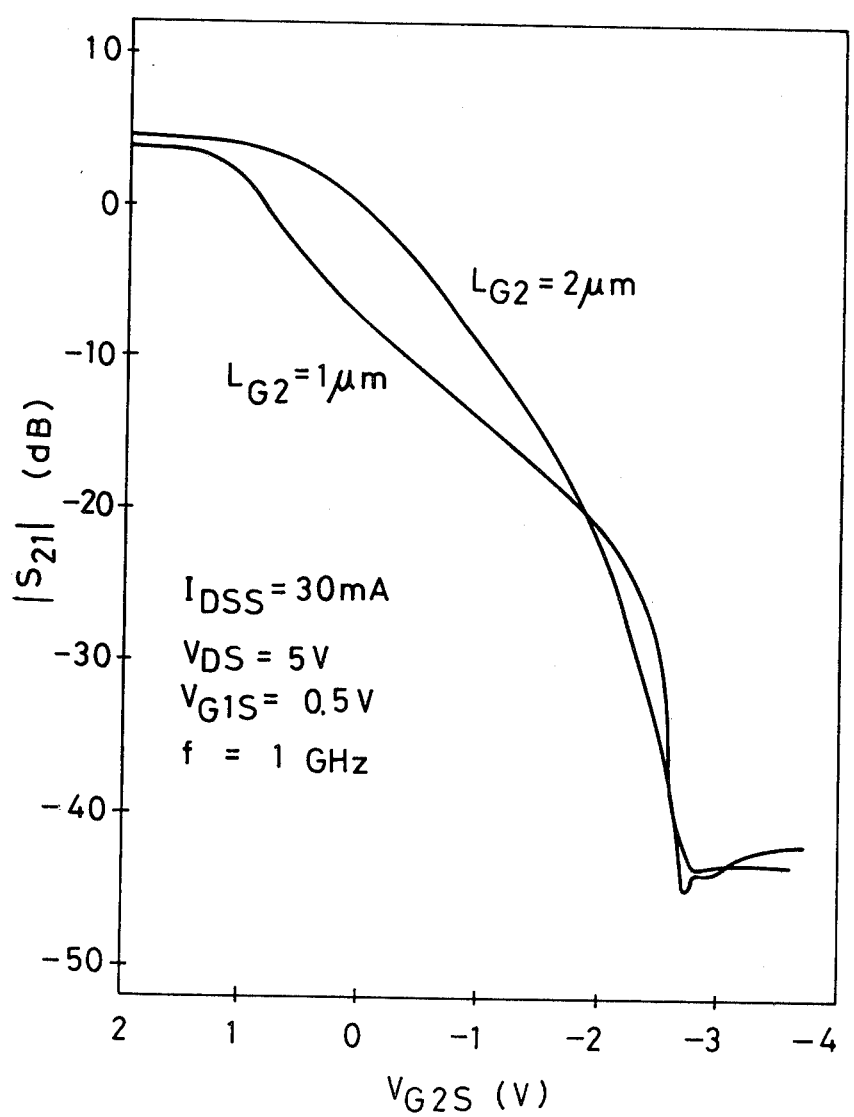
FIG. 5 is a graph showing relations between $|S_{21}|$ and $V_{G2S}$.

The UHF tuner employing the dual gate GaAs FET in accordance with the present invention is very superior in distortion characteristics in the UHF band as elucidated referring to the characteristic graphs of FIG. 5 and FIG. 6, and therefore is very useful in attainment of gain controlling up to about 35 dB gain reduction without noticeable cross-modulation to induce distortion of the signal.

What is claimed is:

1. A dual gate Schottky barrier gate GaAs FET comprising a source, a drain and at least two gate electrodes formed on an active layer for operative controlling of a current through the active layer between the source and the drain, said active layer being sufficiently thin so that the FET has a value of 40 mA or smaller drain to source saturation current, non-linearity of gm of the FET being improved by making the length of a second gate which is disposed between a first gate and said drain of 1.5 μm or longer.

2. A dual gate Schottky barrier gate GaAs FET in accordance with claim 1 wherein the length of said second gate is longer than that of said first gate.

3. In a tuner, a high-frequency amplifier which comprises a dual gate Schottky barrier gate GaAs FET comprising a source a drain and at least two gate electrodes formed on an active layer for operative controlling of a current through the active layer between said source and said drain, said active layer being sufficiently thin so that the FET has a drain to source saturation current set at a value of 40 mA or smaller, non-linearity of gm of the FET being improved by making the second gate of 1.5 μm or longer disposed between a first gate and said drain.

4. In a tuner in accordance with claim 3, said amplifier having an AGC signal connected to said second gate and a UHF signal connected to said first gate.

* * * * *